United States Patent
Tsuji

(10) Patent No.: US 9,966,506 B2
(45) Date of Patent: May 8, 2018

(54) LIGHT-EMISSION DEVICE

(71) Applicant: SHARP KABUSHIKI KAISHA, Sakai, Osaka (JP)

(72) Inventor: Makoto Tsuji, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days. days.

(21) Appl. No.: 15/516,747

(22) PCT Filed: Aug. 26, 2015

(86) PCT No.: PCT/JP2015/074114
§ 371 (c)(1),
(2) Date: Apr. 4, 2017

(87) PCT Pub. No.: WO2016/056316
PCT Pub. Date: Apr. 14, 2016

(65) Prior Publication Data
US 2017/0294562 A1  Oct. 12, 2017

(30) Foreign Application Priority Data
Oct. 9, 2014  (JP) ................ 2014-208376

(51) Int. Cl.
*H01L 33/50* (2010.01)
*H01L 33/48* (2010.01)
(Continued)

(52) U.S. Cl.
CPC .......... *H01L 33/504* (2013.01); *H01L 33/486* (2013.01); *H01L 33/507* (2013.01);
(Continued)

(58) Field of Classification Search
CPC ........................... H01L 33/50–33/505
See application file for complete search history.

(56) References Cited

U.S. PATENT DOCUMENTS

| 2008/0067531 A1* | 3/2008 | Chang ............... H01L 33/58 257/98 |
| 2009/0050911 A1* | 2/2009 | Chakraborty ........ H01L 33/56 257/89 |

(Continued)

FOREIGN PATENT DOCUMENTS

| JP | 2007-250817 | 9/2007 |
| JP | 2008-159707 | 7/2008 |

(Continued)

OTHER PUBLICATIONS

International Search Report for PCT/JP2015/074114 dated Sep. 29, 2015, 4 pages.

(Continued)

*Primary Examiner* — Robert Bachner
*Assistant Examiner* — Molly Reida
(74) *Attorney, Agent, or Firm* — ScienBiziP, P.C.

(57) ABSTRACT

An LED light-emission device includes a substrate, an LED chip, a phosphor-containing resin containing a phosphor and covering the LED chip, and a diffusing agent-containing resin containing a diffusing agent that diffuses light emitted from the phosphor-containing resin and sealing the phosphor-containing resin. The LED chip, the phosphor-containing resin, and the diffusing agent-containing resin are placed on a same flat face of the substrate.

2 Claims, 9 Drawing Sheets

(51) Int. Cl.
  *H01L 33/54* (2010.01)
  *H01L 33/56* (2010.01)
  *C09K 11/77* (2006.01)
  *C09K 11/08* (2006.01)

(52) U.S. Cl.
  CPC ............ *H01L 33/508* (2013.01); *H01L 33/54* (2013.01); *H01L 33/56* (2013.01); *C09K 11/0883* (2013.01); *C09K 11/7734* (2013.01); *C09K 11/7774* (2013.01)

(56) References Cited

U.S. PATENT DOCUMENTS

| | | | |
|---|---|---|---|
| 2009/0180273 A1* | 7/2009 | Kim | H01L 25/0753 362/84 |
| 2011/0309390 A1 | 12/2011 | Liu et al. | |
| 2014/0042472 A1 | 2/2014 | Kobayashi | |
| 2014/0054616 A1 | 2/2014 | Tseng et al. | |
| 2014/0054619 A1 | 2/2014 | Tseng et al. | |
| 2014/0264268 A1 | 9/2014 | Tseng et al. | |
| 2014/0291610 A1 | 10/2014 | Tseng et al. | |
| 2014/0291611 A1 | 10/2014 | Tseng et al. | |
| 2014/0295593 A1 | 10/2014 | Tseng et al. | |
| 2014/0306245 A1 | 10/2014 | Hayashi et al. | |

FOREIGN PATENT DOCUMENTS

| | | |
|---|---|---|
| JP | 2008-159708 | 7/2008 |
| JP | 2009-054995 | 3/2009 |
| JP | 2009-510764 | 3/2009 |
| JP | 2012-044048 | 3/2012 |
| JP | 2012-519972 | 8/2012 |
| JP | 5149601 | 2/2013 |
| JP | 5180564 | 4/2013 |
| JP | 2014-036083 | 2/2014 |
| JP | 2014-045194 | 3/2014 |
| JP | 2014-220490 | 11/2014 |

OTHER PUBLICATIONS

International Preliminary Report on Patentability for PCT/JP2015/074114 dated Sep. 20, 2016, 23 pages.

* cited by examiner

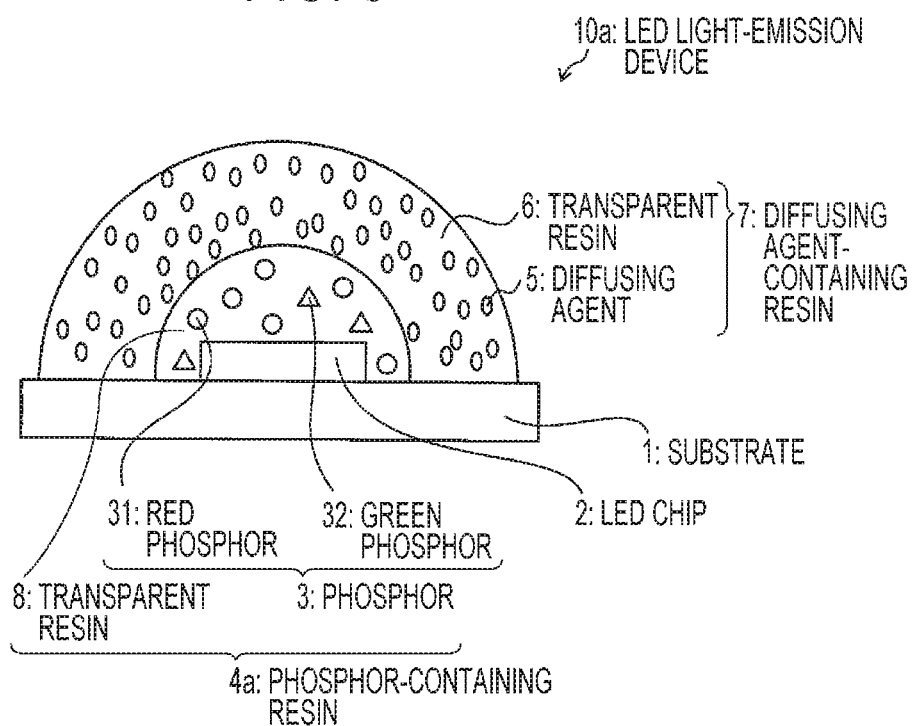
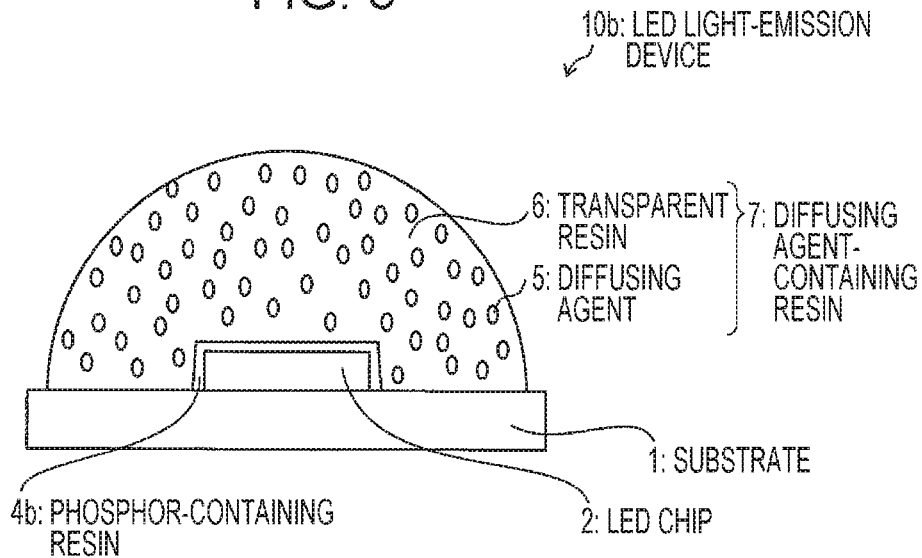

LIGHT-EMISSION DEVICE

TECHNICAL FIELD

This application is the U.S. national phase of International Application No. PCT/JP2015/074114 filed Aug. 26, 2015 which designated the U.S. and claims priority to JP Patent Application No. 2014-208376 filed Oct. 9, 2014, the entire contents of each of which are hereby incorporated by reference.

The present invention relates to a light-emission device.

BACKGROUND ART

LEDs (Light Emitting Diodes) have come into widespread use in backlights for display devices and lighting equipment as light sources that conserve more energy than light bulbs and fluorescent lights, in accordance with improved efficiency in recent years. Many light-emission devices using light-emission elements such as LEDs have conventionally been proposed. A light-emission device where a light-emission element mounted on a substrate is covered with a resin containing a phosphor (fluorescent particles) is particularly well known. There is demand in recent years for further improvement in light-emission efficiency. A double-sealed light-emission device, having a structure where phosphor-containing resin that covers a light-emission element mounted on a substrate is further sealed by a transparent resin, has been proposed to improve light-emission efficiency.

For example, PTL 1 describes a light-emission device including a first LED set and a second LED set disposed within a reflecting cup, a first set of phosphor layers coating the first LED set, and a second set of phosphor layers coating the second LED set, where a transparent layer is configured covering these sets, and further, a diffusion layer that can be combined with the transparent layer is disposed above the transparent layer (hereinafter referred to as "first light-emission device").

PTL 1 also describes a light-emission device having surface-adhering LEDs, to which the above-described light-emission device has been applied (hereinafter referred to as "second light-emission device"). More specifically, this second light-emission device is configured with a first LED set and second LED set adhered onto a base, and a transparent layer is configured covering the first LED set and second LED set. A first set of phosphor layers and a second set of phosphor layers are configured to respectively cover the first LED set and second LED set, at positions of the transparent layer corresponding to the first LED set and second LED set. Further, a transparent enclosure layer is disposed so as to cover the first LED set, second LED set, transparent layer, first set of phosphor layers, second set of phosphor layers, and an input terminal.

CITATION LIST

Patent Literature

PTL 1: Published Japanese Translation of PCT International Publication For Patent Application "Japanese Unexamined Patent Application Publication (Translation of PCT Application) No. 2012-519972 (publication date Aug. 30, 2012)".

SUMMARY OF INVENTION

Technical Problem

However, the first light-emission device described in PTL 1 emits light of peak wavelengths that are different from each other, by a combination of the first LED chip and first set of phosphor layers and a combination of the second LED chip and second set of phosphor layers. Accordingly, the structure is such that light of different wavelengths depending on the location is emitted from one first light-emission device, so there is a problem that variance in color occurs in the light radiated from the first light-emission device, even if there is a diffusion layer.

The first light-emission device generates radiant light by the first LED set and the second LED set within the reflection cup, radiant light by the first and second sets of phosphor layers that have been excited, and reflection light from the reflection cup. However, the light generated within the reflection cup is only radiated to the side of the reflection cup that is opened (the direction opposite to the substrate), and light is not radiated in other directions. Accordingly, there is a problem that even if the first light-emission device is applied to the second light-emission device, there may be a region in the transparent enclosure layer where light from the phosphor layers does not reach, and there may be variance in color occurring in the light radiated from the second light-emission device having the surface-adhering LEDs.

The present invention has been made in light of the above-described problems, and it is an object thereof to provide a light-emission device where variance in color of radiated light is prevented, and chromaticity is uniform in all directions in which the light is radiated.

Solution to Problem

In order to solve the above-described problem, a light-emission device according to an aspect of the present invention includes a flat substrate, at least one blue light-emission element that emits blue light where a peak wavelength of light emission is near 450 nm or 405 nm, a phosphor-containing resin containing at least two types of phosphor including red phosphor and green phosphor, that absorb light from the light-emission element and emit fluorescence, the red phosphor including at least one of a CaAlSiN3:Eu and a (Sr, Ca)AlSiN3:Eu and the green phosphor including at least one of a Lu3Al5O12:Ce and a (Si, Al)6(O, N)8:Eu, the phosphor-containing resin completely covering the light-emission element; and a diffusing agent-containing layer covering the phosphor-containing resin. The diffusing agent containing layer includes transparent resin and one type of diffusing agent having an average particle size of 3 to 5 μm where a ratio by weight of the diffusing agent and transparent resin is 10% to 30% and the diffusing agent is uniformly distributed in the diffusing-agent containing layer, diffuses light that has been output from the light-emission element and the output light of which the wavelength has been changed by the phosphor, emitted from the phosphor-containing resin, and is hemispherical. The light-emission element, phosphor-containing resin, and diffusing agent-containing layer are placed on a same flat face of the substrate. In a chromaticity diagram (CIE 1931), a difference between chromaticity coordinates of a color of light at each measurement angle, from measurement angle −80° to measurement angle +80°, radiated from the light-emission device, and chromaticity coordinates of a color of light at an intersection between a line that passes through the center of the diffusing agent-containing layer and is perpendicular to the substrate and a measurement arc, is −0.04 or more but +0.04 or less for both x value and y value.

Advantageous Effects of Invention

According to one aspect of the present invention, there is an advantageous effect that a light-emission device can be provided where variance in color of radiated light is prevented, and chromaticity is uniform in all directions in which the light is radiated.

BRIEF DESCRIPTION OF DRAWINGS

FIG. 5 is a sectional view illustrating the configuration of the LED light-emission device according to Embodiment 2.

FIG. 6 is a sectional view illustrating the configuration of the LED light-emission device according to Embodiment 3.

DESCRIPTION OF EMBODIMENTS

[Embodiment 1]

Figure 1:
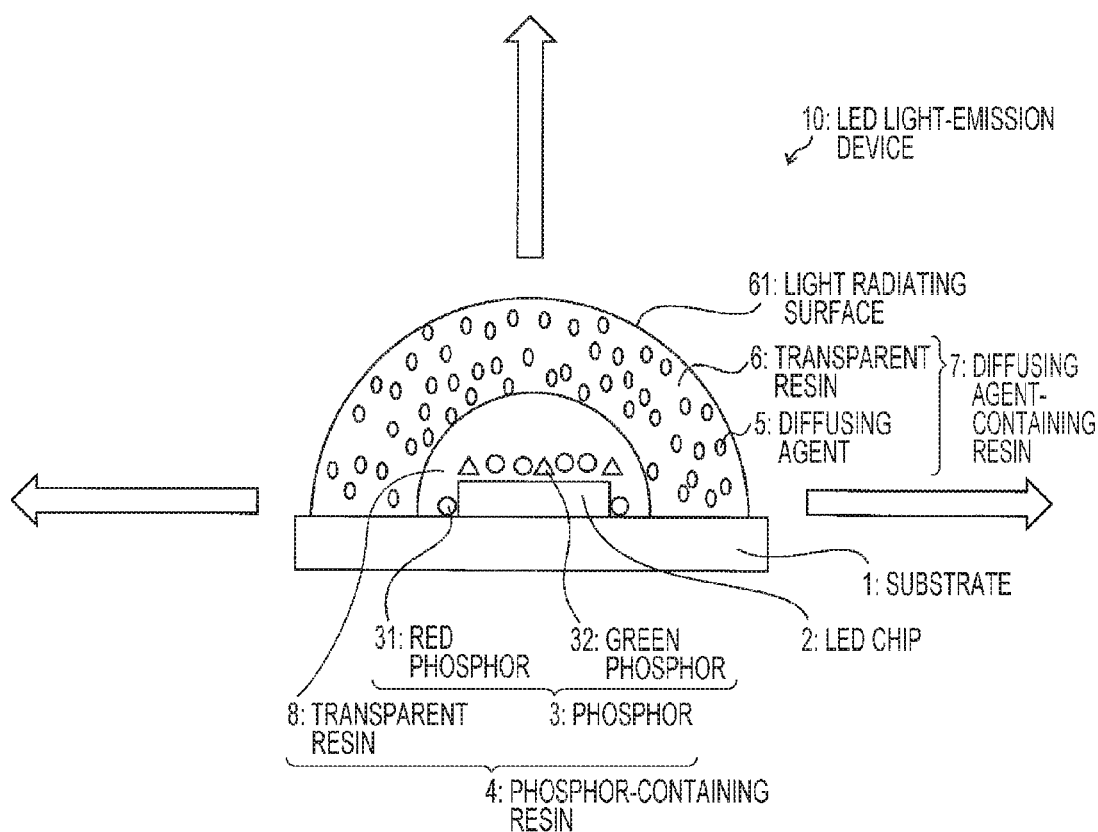
FIG. 1 is a sectional view illustrating the configuration of an LED light-emission device according to Embodiment 1.

Embodiment 1 of the present invention will be described with reference to FIG. 1 through FIG. 4, FIG. 9, and FIG. 10. For sake of convenience in description, members that have the same functions as members illustrated in the embodiments will be denoted by the same reference numerals, and description thereof will be omitted as appropriate.

[Configuration of LED Light-Emission Device]

FIG. 1 is a sectional view illustrating the configuration of an LED light-emission device 10 according to Embodiment 1.

As illustrated in FIG. 1, the LED light-emission device (light-emission device) 10 includes an LED chip (light-emission element) 2, phosphor-containing resin (phosphor-containing layer) 4, and diffusing agent-containing resin (diffusing agent-containing layer) 7 on a substrate 1.

The substrate 1 is a planar substrate, and is a wiring substrate to which the LED chip 2 is mounted. The substrate 1 preferably is of a material that has high light reflection at the principal face thereof, which is the mounting face for the LED chip 2. An example of the substrate 1 is a ceramic substrate. The LED chip 2, phosphor-containing resin 4, and diffusing agent-containing resin 7 are disposed on the mounting face (on the same flat face) of the substrate 1. A wiring pattern (not illustrated) including electrodes is also formed on the mounting face of the substrate 1. The wiring pattern is provided at a predetermined position, in accordance with the mounting position of the LED chip 2.

The LED chip 2 is a light emitting diode that emits blue light of which the light-emission peak wavelength is in the vicinity of 450 nm, and outputs light to the later-described phosphor-containing resin 4. The LED chip 2 is mounted on the mounting face of the substrate 1. The LED chip 2 is electrically connected to the wiring pattern of the substrate 1 by wire bonding (not illustrated) using gold wire, for example.

Although description is made in the present embodiment that one LED chip 2 is used in the LED light-emission device 10, the number of LED chips 2 is not restricted to one. The number of LED chips 2 that the LED light-emission device 10 has may be two or more. Further, the shape of the LED chip 2 is not restricted in particular, and may be a cube or a cuboid, for example.

The phosphor-containing resin 4 has multiple phosphors 3 in transparent resin 8, and emits output light being output from the LED chip 2, and light (fluorescence) of which the wavelength of the output light has been converted by the phosphor 3. The phosphor-containing resin 4 covers and seals the LED chip 2. An example that can be used for the transparent resin 8 is dimethyl silicone.

The phosphor 3 includes red phosphor 31 and green phosphor 32. The red phosphor 31 absorbs light output from the LED chip 2, converts the wavelength of the output light, and emits light having a red color. In the present embodiment, $CaAlSiN_3$:Eu and $(Sr, Ca)AlSiN_3$:Eu are used as the red phosphor. The green phosphor 32 absorbs light output from the LED chip 2, converts the wavelength of the output light, and emits light having a green color. In the present embodiment, $Lu_3Al_5O_{12}$:Ce is used as the green phosphor. Note that one kind of red phosphor may be used, and the proportion by weight of the red phosphor 31 and green phosphor 32 may be set as appropriate. Further, the phosphor 3 is not restricted to those described above, and may be set as appropriate.

The phosphor 3 is settled around the LED chip 2 in the phosphor-containing resin 4. In other words, a greater amount of phosphor 3 exists in the phosphor-containing resin 4 on the surface and around the sides of the LED chip 2. This term "a greater amount exists" means that a greater amount of phosphor 3 exists in the phosphor-containing resin 4 on the surface and around the sides of the LED chip 2, as compared to other (e.g., at the perimeter of the phosphor-containing resin 4) than on the surface and around the sides of the LED chip 2. This does not mean only that there is absolutely no phosphor 3 present at the perimeter of the phosphor-containing resin 4; this includes a state where substantially more phosphor 3 exists on the surface and around the sides of the LED chip 2. Accordingly, the probability of light emitted from the phosphor 3 striking and being absorbed by other phosphor 3 again is lower as compared to a case where the phosphor 3 is dispersed so as to be spread throughout the phosphor-containing resin 4. Each time light is absorbed by phosphor 3, the brightness decreases. Accordingly, brightness can be maintained by preventing light from the phosphor 3 from striking and being absorbed by other phosphor 3 again.

Now, an example of a method of forming the phosphor-containing resin 4 will be described. First, the phosphor-containing resin 4 obtained by mixing the phosphor 3 and transparent resin 8 is applied to the substrate 1 so as to cover the LED chip 2, using an injection mold or the like. Thereafter, the phosphor-containing resin 4 is left standing at room temperature for around half a day to let the phosphor 3 settle, and then is subjected to thermal hardening under conditions of temperature of 100 to 150° C. for 1 to 5 hours. Thus, a phosphor-containing resin 4 where the phosphor 3 has settled around the LED chip 2 can be formed. In order to enable the phosphor 3 to settle around the LED chip 2, the specific gravity of the phosphor 3 is preferably greater than that of the transparent resin 8, and the particle size of the phosphor 3 preferably is 5 to 100 μm. The viscosity of the transparent resin 8 preferably is 8000 mPas or lower. Further, the ratio by weight of the phosphor 3 as to the transparent resin 8 in the phosphor-containing resin 4 preferably is 100% or less.

The diffusing agent-containing resin 7 contains a diffusing agent 5 in transparent resin 6. The diffusing agent 5 diffuses light emitted from the phosphor-containing resin 4 so that light is externally radiated from the surface (light radiating surface 61) of the diffusing agent-containing resin 7. The diffusing agent-containing resin 7 is disposed on the surface (outer periphery) of the phosphor-containing resin 4, thereby sealing the phosphor-containing resin 4.

The diffusing agent-containing resin 7 is formed on the substrate 1 in the shape of a hemisphere (dome-shaped). In other words, the diffusing agent-containing resin 7 has a shape where the distance between one point on the surface of the substrate 1 (referred to hereinafter simply as center of diffusing agent-containing resin 7) on a center axis of the diffusing agent-containing resin 7 perpendicular the substrate 1 (center point of diffusing agent-containing resin 7 in plan view), and the light radiating surface 61, is the same. Note that the term "distance is the same" includes cases where the distance is deemed to be substantially the same. Due to the diffusing agent-containing resin 7 having a hemisphere shape, light distribution is broader as compared to a case where the diffusing agent-containing resin 7 does not have a hemisphere shape. Consequently, the LED light-emission device 10 can radiate light over a broad range.

The diffusing agent 5 irregularly reflects and diffuses light emitted from the phosphor-containing resin 4, i.e., the light output from the LED chip 2 and the light emitted by the phosphor 3, as described above. Thus, the color of the light output from the LED chip 2 and the color of the light generated by the phosphor 3 mix, and the chromaticity of the light from the LED light-emission device 10 is uniform in all directions in which it is radiated.

The diffusing agent 5 exists in a dispersed manner in the diffusing agent-containing resin 7. In other words, the diffusing agent 5 is distributed uniformly throughout the diffusing agent-containing resin 7. Materials that can be used as the diffusing agent 5 include $TiO_2$, $BaCO_3$, $BaSO_4$, $SiO_2$, and so forth, which exhibit low photoabsorption. $SiO_2$ has excellent light resistance properties, heat resistance properties, and chemical resistance properties (acid and alkali), so in a case of using $SiO_2$ as the diffusing agent 5, reliability of diffusing light from the phosphor-containing resin 4 can be maintained. Further, $SiO_2$ is light as compared to the resin used for the transparent resin 6. Accordingly, the diffusing agent 5 does not readily sink in the transparent resin 6 while forming the diffusing agent-containing resin 7, and thus the diffusing agent-containing resin 7 can be formed while maintaining the state in which the diffusing agent 5 is uniformly distributed in the transparent resin 6.

Although the more the amount of diffusing agent 5 contained in the diffusing agent-containing resin 7 is, the greater the diffusing effects of light are, but if the amount of diffusing agent 5 contained in the diffusing agent-containing resin 7 is excessively large, the probability of light irregularly reflected by the diffusing agent 5 being reabsorbed by the phosphor 3 increases. Further, conceivably, the light radiated externally from the diffusing agent-containing resin 7 may be darker, due to the transmittance of the diffusing agent-containing resin 7 being lower and so forth. Accordingly, the diffusing agent 5 is preferably 10 to 30% in terms of weight ratio as to the transparent resin 6.

Although the shape of the diffusing agent 5 is not restricted in particular, a spherical shape having an average particle size of 3 to 5 μm is preferable. By the diffusing agent 5 having a spherical shape, light striking the diffusing agent 5 from all directions can be reflected.

The same resin as that used for the transparent resin 8 may be used for the transparent resin 6. The transparent resin 6 and transparent resin 8 have transmissivity, meaning that they transmit light. It is sufficient for the transparent resin 6 and transparent resin 8 to transmit greater part of the light from the LED chip 2 and the light from the phosphor-containing resin 4.

The present embodiment is not restricted to the above-described combination of the LED chip 2 and phosphor 3, and may be set as appropriate. For example, instead of the above-described combination, the LED chip 2 may be replaced by a blue-violet light emission LED chip of which the light-emission peak wavelength is in the vicinity of 405 nm, or the green phosphor 32 may be $(Si, Al)_6(O, N)_8$:Eu or the like.

[Advantageous Effects of Diffusing Agent]

Figure 9:
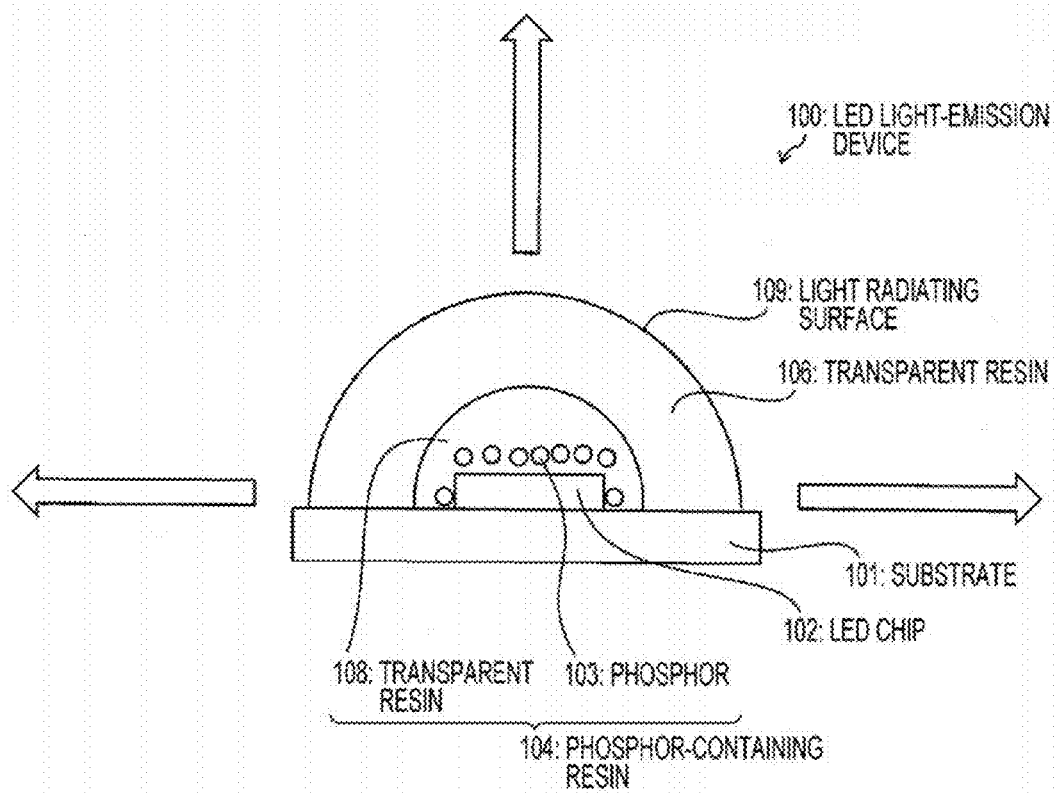
FIG. 9 is a sectional view illustrating the configuration of a conventional LED light-emission device.

The advantageous effects of the diffusing agent will be described in detail with reference to FIG. 1 through FIG. 4 and FIG. 9. FIG. 9 is a sectional view illustrating the configuration of a conventional LED light-emission device 100.

The conventional LED light-emission device 100 includes a substrate 101, an LED chip 102, phosphor-containing resin 104, and transparent resin 106, as illustrated in FIG. 9. The phosphor-containing resin 104 includes phosphor 103 in transparent resin 108. The substrate 101, LED chip 102, phosphor 103, phosphor-containing resin 104, and transparent resin 108 have the same functions as the substrate 1, LED chip 2, phosphor 3, phosphor-containing resin 4, and transparent resin 8 in the present embodiment. However, the transparent resin 106 does not include the diffusing agent, unlike the diffusing agent-containing resin 7.

The LED light-emission device 100 is influenced by the state of settling of the phosphor 103 and so forth, and the color of light slightly changes depending on the direction of radiating. In other words, the light radiated from the LED light-emission device 100 has angular dependency, and variance in color occurs.

Specifically, there is a tendency for blue light to be readily radiated from the LED light-emission device 100 in a direction parallel to the mounting face along the substrate 101, and yellow light to be readily radiated in a direction perpendicular to the above direction. A conceivable cause is that, for example, there is little phosphor 103 settled near the sides of the LED chip 102, and there is a great amount of phosphor 103 settled near the upper face of the LED chip 102, and so forth. In a case where the LED light-emission device 100 having the above described tendency is applied in lighting equipment such as a ceiling light or the like, or if a lens is attached to the LED light-emission device 100, or the like, the above angular dependency clearly appears. Accordingly, light radiated from equipment to which the LED light-emission device 100 is applied is not uniform, and variance in color clearly appears.

Conversely, as illustrated in FIG. 1, the LED light-emission device 10 according to the present embodiment contains the diffusing agent 5 in the diffusing agent-containing resin 7. Accordingly, the color of light (chromaticity) radiated from the LED light-emission device 10 is uniform regardless of the angle.

Specifically, in the LED light-emission device 10, there is a tendency for blue light to be readily emitted from the phosphor-containing resin 4 in a direction parallel to the mounting face along the substrate 1, and yellow light to be readily emitted from the phosphor-containing resin 4 in a direction perpendicular to the above direction, in the same way as with the phosphor-containing resin 104.

However, the diffusing agent-containing resin 7 diffuses the light emitted from the phosphor-containing resin 4 by the diffusing agent 5, and the light is externally radiated. In other words, the light exiting the phosphor-containing resin 4 is repeatedly diffused by the diffusing agent 5 and thus externally radiated. Accordingly, the colors of light emitted from the phosphor-containing resin 4 are mixed, and the light radiated from the LED light-emission device 10 has a uniform chromaticity regardless of the angle.

Figure 2:
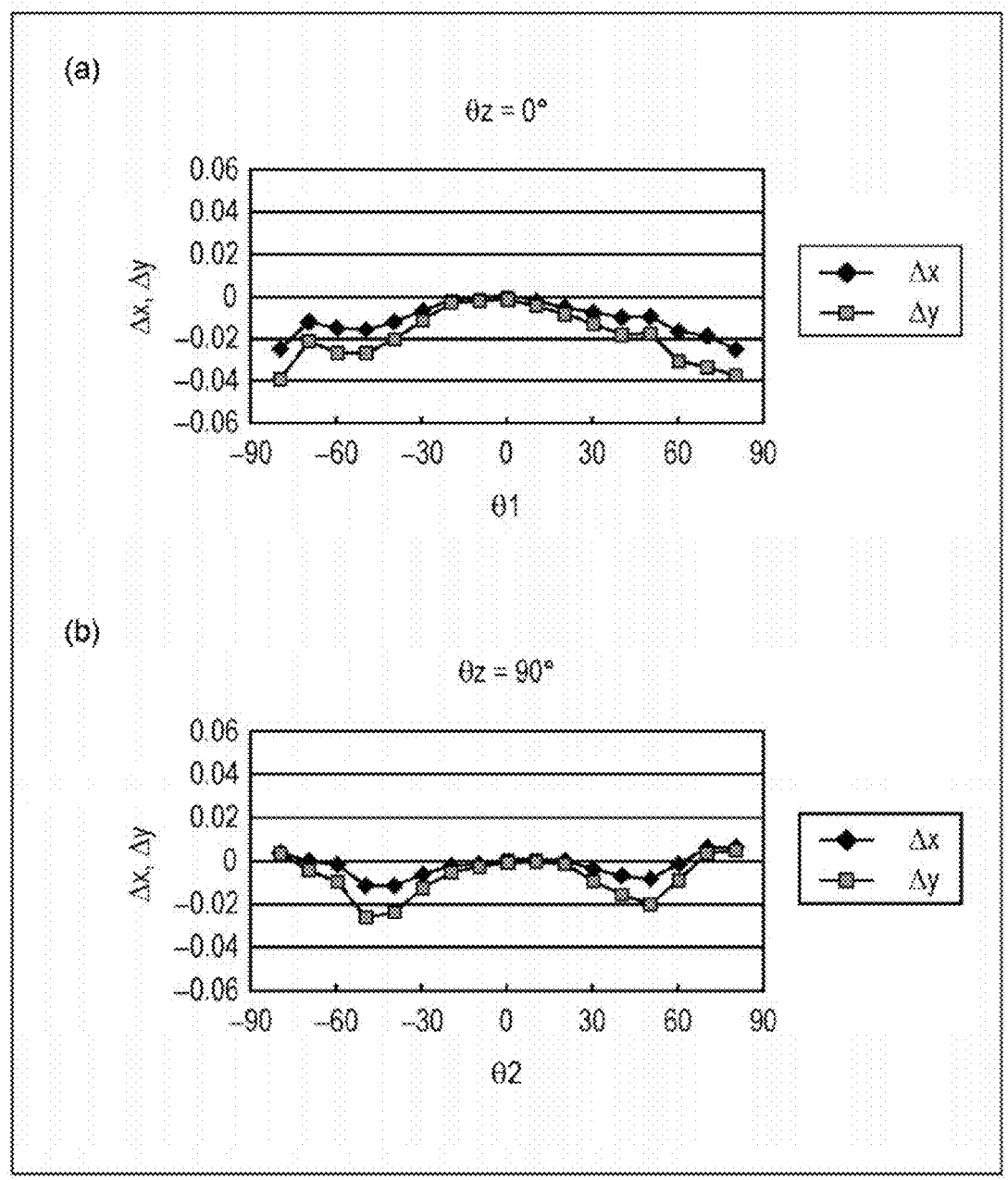
FIGS. 2(a) and 2(b) are graphs illustrating angle dependency of chromaticity in a conventional LED light-emission device.
Figure 3:
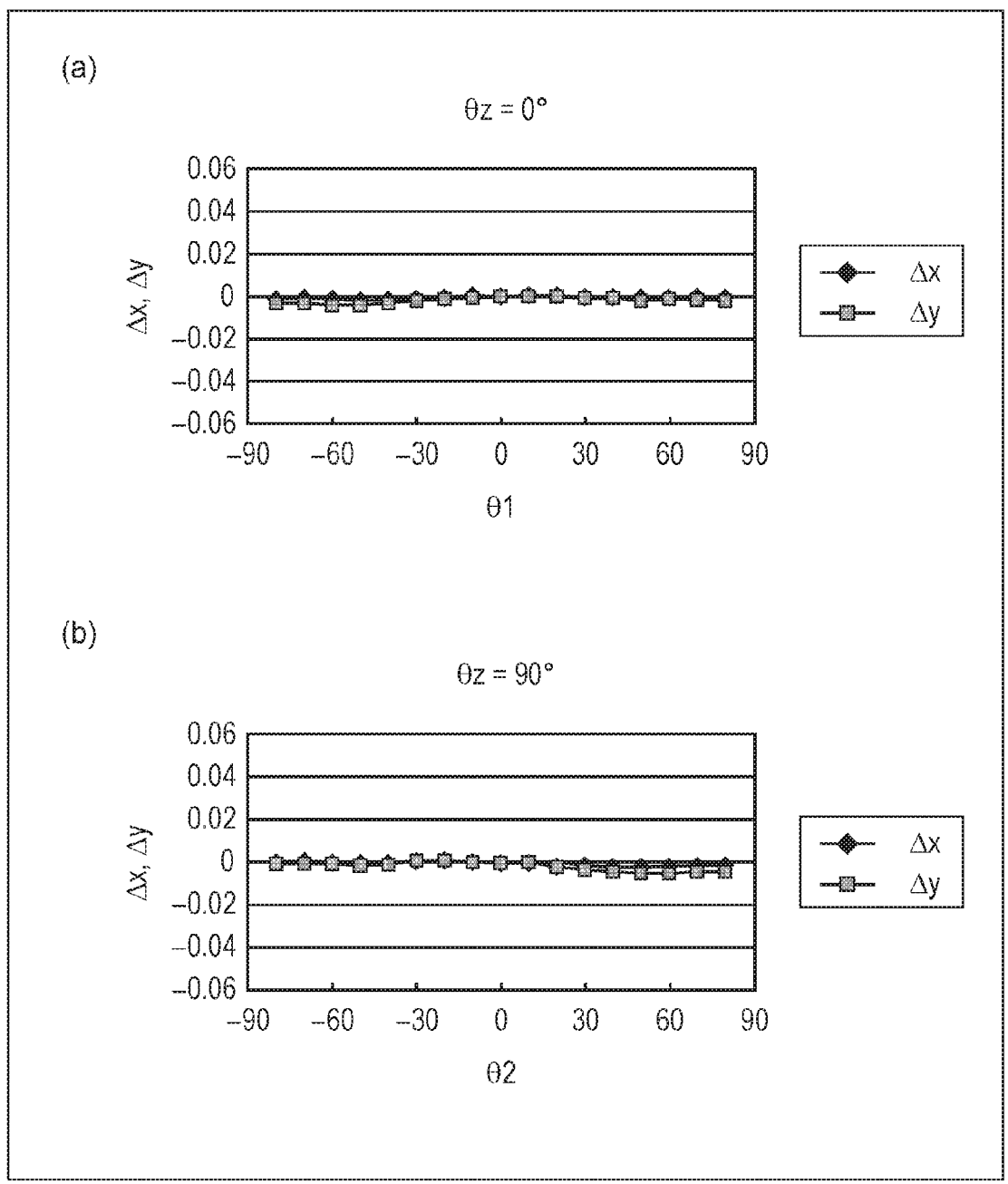
FIGS. 3(a) and 3(b) are graphs illustrating angle dependency of chromaticity in the LED light-emission device according to Embodiment 1.
Figure 4:
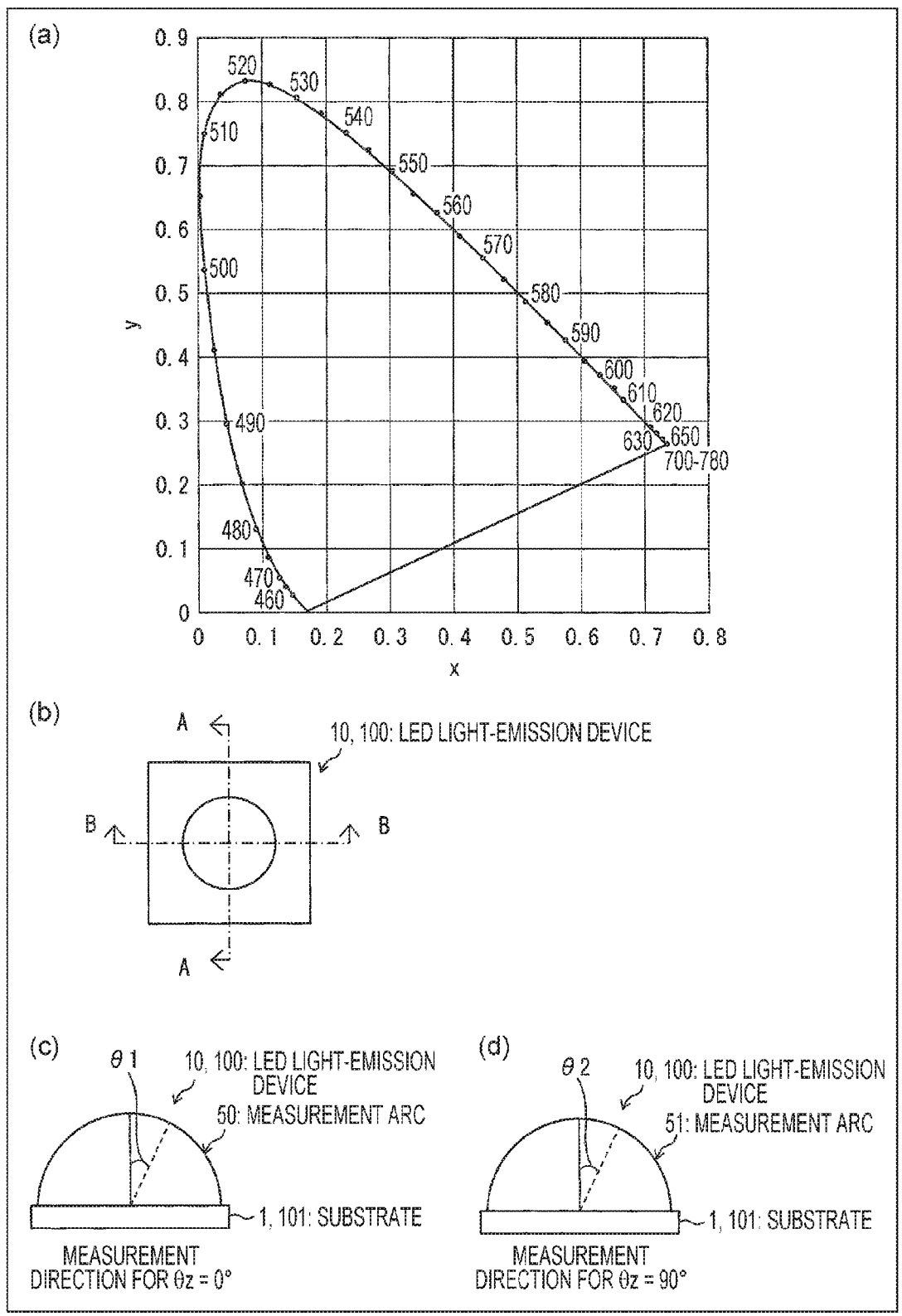
FIG. 4(a) is a chromaticity diagram used for measurement in FIG. 3, and FIGS. 4(b) through 4(d) are diagrams illustrating measurement directions of the measurement in FIG. 3.

The following is a description of the advantageous effects of the LED light-emission device 10 according to the present embodiment, with reference to FIG. 2 through FIG. 4. FIG. 2 is a graph illustrating chromatic angular dependency of the conventional LED light-emission device 100, illustrating the chromatic angular dependency of the LED light-emission device 100 at measurement positions on a light radiating surface 109 (see FIG. 9). More specifically, FIG. 2(a) illustrates the chromatic angular dependency of radiated light measured with measurement direction θz=0° as a reference, and FIG. 2(b) illustrates the chromatic angular dependency of radiated light measured with measurement direction θz=90° as a reference. FIG. 3 is a graph illustrating chromatic angular dependency of the LED light-emission device 10 according to the present embodiment, illustrating the chromatic angular dependency of the LED light-emission device 10 at measurement positions on the light radiating surface 61 (see FIG. 1). More specifically, FIG. 3(a) illustrates the chromatic angular dependency of radiated light measured with measurement direction θz=0° as a reference, and FIG. 3(b) illustrates the chromatic angular dependency of radiated light measured with measurement direction θz=90° as a reference. FIG. 4(a) is a chromaticity diagram (CIE 1931) used for the measurement in FIG. 3, with the vertical axis (y) and horizontal axis (x) in FIG. 4(a) representing chromaticity, and the numbers at the perimeter of the curved potion of the chromaticity diagram representing wavelengths (nm). FIG. 4(b) through 4(d) are diagrams illustrating the measurement direction of the measurement in FIG. 3. FIG. 4(c) is a sectional view taken along the arrow line B-B passing through the center of the diffusing agent-containing resin 7 in FIG. 4(b), with illumination light being measured following a measurement arc 50 illustrated in FIG. 4(c) at measurement direction θz =0°. FIG. 4(d) is a sectional view taken along the arrow line A-A passing through the center of the diffusing agent-containing resin 7 in FIG. 4(b), with illumination light being measured following a measurement arc 51 illustrated in FIG. 4(d) at measurement direction θz=90°.

The horizontal axes in the graphs in FIGS. 2(a) and 2(b) and FIGS. 3(a) and 3(b) represent angle θ1 (see FIG. 4(c)) and angle θ2 (see FIG. 4(d)) from θz=0° and θz=90° of the measured illumination light. 0° for the angle θ1 and angle θ2 is the intersection between measurement arcs 50 and 51 and a line perpendicular to the substrates 1 and 101 passing through the center of the diffusing agent-containing resin 7. The positive direction of the angle is in the clockwise direction.

The vertical axes in the graphs in FIGS. 2(a) and 2(b) and FIGS. 3(a) and 3(b) represent values of deviation from the reference values in the chromaticity diagram illustrated in FIG. 4(a). More specifically, the vertical axes indicate how much chromaticity coordinates (x2, y2) (not illustrated) of radiated light measured at each measurement angle have deviated from chromaticity coordinates (x1, y1) (not illustrated) serving as a reference, based on the above chromaticity diagram. That is, Δx represents x2−x1, and Δy represents y2−y1. This indicates that the greater a negative value that Δx and Δy are, the closer the measured radiated light is to be blue as compared to the reference color. Note that the reference value (reference color) can be set as appropriate.

As indicated in FIGS. 2(a) and 2(b) and FIGS. 3(a) and 3(b), while the chromaticity of measured radiated light of the LED light-emission device 100 exhibited great deviation from the reference value, the chromaticity of measured radiated light of the LED light-emission device 10 exhibited almost no deviation from the reference value. These measurement results show that variance of color in radiated light is improved by the diffusing agent 5 according to the present embodiment, and that light radiated from the LED light-emission device 10 has uniform chromaticity in all directions.

[Advantageous Effects of Placement of Configurations in LED Light-Emission Device]

Figure 10:
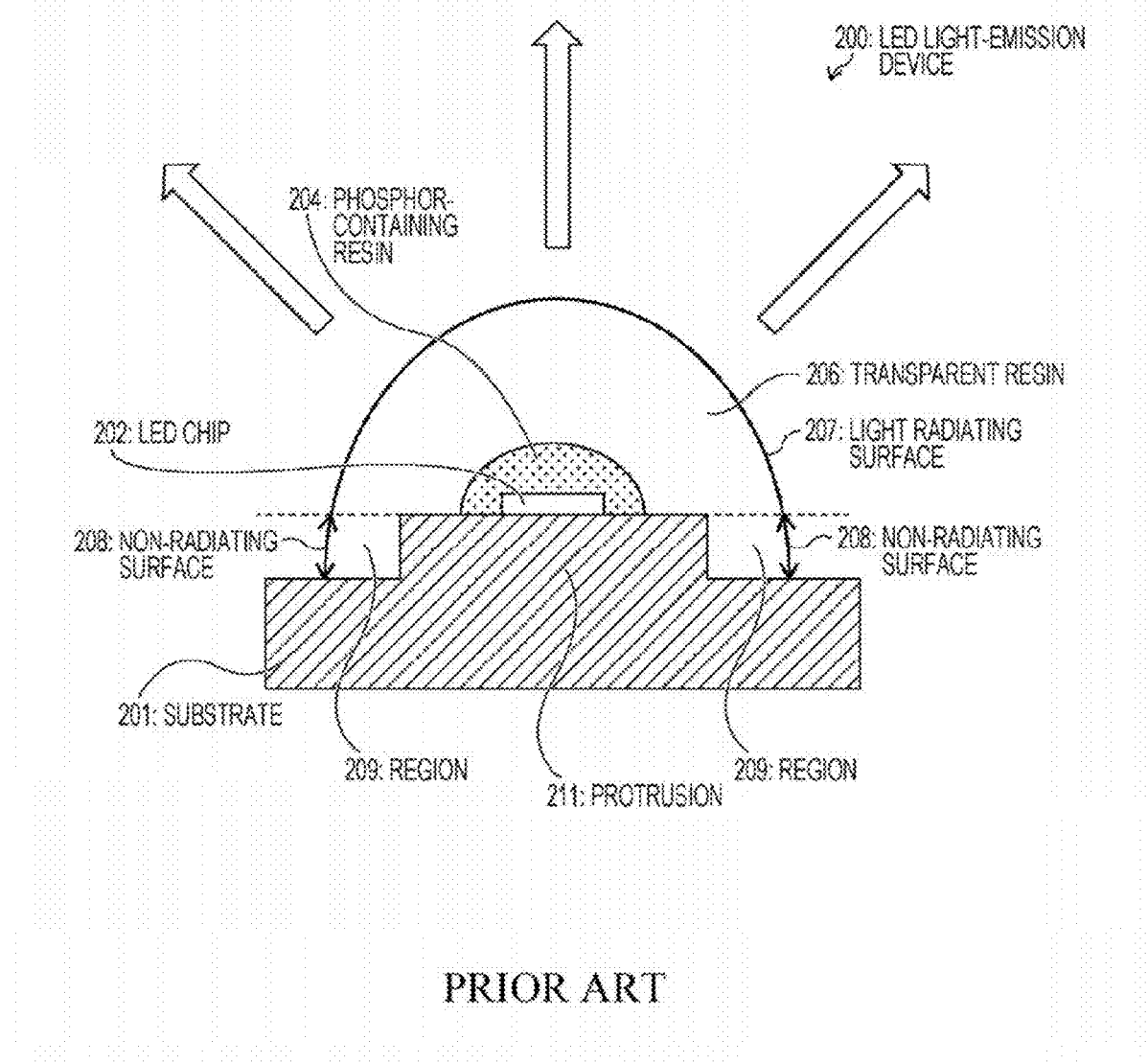
FIG. 10 is a sectional view illustrating the configuration of another conventional LED light-emission device.

The advantageous effects of placement of the configurations in the LED light-emission device 10 will be described with reference to FIG. 1 and FIG. 10. FIG. 10 is a sectional view illustrating the configuration of another conventional LED light-emission device 200.

The LED chip 2, phosphor-containing resin 4, and diffusing agent-containing resin 7 are placed on the mounting face (on the same flat face) of the substrate 1 in the present embodiment, as described above. Accordingly, light emitted from the phosphor-containing resin 4 reaches the diffusing agent-containing resin 7 even in the region along the substrate 1. Accordingly, there is no region occurring in the diffusing agent-containing resin 7 where light from the phosphor-containing resin 4 does not reach, and thus there is no variance in brightness and color in the light radiated from the LED light-emission device 10, and light with uniform chromaticity is radiated in all directions from the LED light-emission device 10. This will be described below.

As illustrated in FIG. 10, the conventional LED light-emission device 200 includes a substrate 201, an LED chip 202, phosphor-containing resin 204, and transparent resin 206. The substrate 201, LED chip 202, phosphor-containing resin 204, and transparent resin 206 have the same functions as the substrate 1, LED chip 2, phosphor-containing resin 4, and transparent resin 6 according to the present embodiment, but the placement positions differ. Specifically, the LED chip 202 and phosphor-containing resin 204 are placed on the upper face of a protrusion 211 protruding upwards from the upper face of the substrate 201 on which the transparent resin 206 is disposed. Note that no diffusing agent is contained in the transparent layer 206.

In the case of the LED light-emission device 200, the LED chip 202 and phosphor-containing resin 204 are disposed on the upper face of the protrusion 211, and thus the light from the phosphor-containing resin 204 to the transparent resin 206 is only emitted to the opposite side from the substrate 201 side as viewed from the upper face of the protrusion 211. In other words, the light from the phosphor-containing resin 204 does not reach the transparent resin 206 at the side of the substrate 201 as viewed from the upper face of the protrusion 211. Thus, there is a region 209 formed in the transparent resin 206 where light from the phosphor-containing resin 204 does not reach. Since light does not reach the region 209, on the surface of the transparent resin 206 (light radiating surface 207), light is not radiated from a non-radiating surface 208 at the surface of the region 209. Consequently, there is variance in brightness and color in the light radiated from the transparent resin 206 (light radiated from the entire light radiating surface 207 including the non-radiating surface 208). That is to say, if a region 209 where light from the phosphor-containing resin 204 does not reach exists in the transparent resin 206 that externally radiates light, there will be variance in brightness and color in the light radiated from the LED light-emission device 200.

Conversely, as illustrated in FIG. 1, in the LED light-emission device 10 according to the present embodiment, the LED chip 2, phosphor-containing resin 4, and diffusing agent-containing resin 7 are disposed on the same flat face of the substrate 1. Accordingly, a region where light from the phosphor-containing resin 4 does not reach is not formed in the diffusing agent-containing resin 7. Consequently, there is no variance in brightness and color in the light radiated from the LED light-emission device 10, and light with uniform chromaticity is radiated from the LED light-emission device 10 in all directions.

[Embodiment 2]

Embodiment 2 of the present invention will be described with reference to FIG. 5. FIG. 5 is a sectional view of the configuration of a LED light-emission device 10a according to Embodiment 2. The LED light-emission device 10a differs from the LED light-emission device 10 with regard to the point that a phosphor-containing resin 4a is provided instead of the phosphor-containing resin 4; the other configurations are the same.

[Configuration of LED Light-Emission Device]

The phosphor-containing resin 4a differs from the phosphor-containing resin 4 with regard to the point that the phosphor 3 is dispersed so as to spread throughout the phosphor-containing resin 4a. Accordingly, light from the LED chip 2 can uniformly strike the phosphor 3 in all directions emitted. Thus, the light from the phosphor 3, and light emitted from the LED chip 2 that reaches the diffusing agent-containing resin 7 without the wavelength thereof being converted by the phosphor 3, can be prevented from being disproportionately biased in a particular direction. As a result, light of uniform color can be emitted from the phosphor-containing resin 4a to the diffusing agent-containing resin 7 in all directions more than as compared to a case where the phosphor 3 does not exist in a manner dispersed so as to spread throughout the phosphor-containing resin 4a.

It is conceivable that the shape of the phosphor-containing resin 4a may cause the distance of the light emitted from the LED chip 2 passing through the phosphor-containing resin 4a to change, thereby causing the color of the light emitted from the phosphor-containing resin 4a to the diffusing agent-containing resin 7 to change depending on the direction. However, even in such a case, the phosphor-containing resin 4a is sealed by the diffusing agent-containing resin 7, and thus the light from the phosphor-containing resin 4a is repeatedly diffused by the diffusing agent 5 and externally radiated. Accordingly, the colors of light emitted from the phosphor-containing resin 4a are mixed, and the light radiated from the LED light-emission device 10a has a uniform chromaticity in all directions.

An example of a method for forming the phosphor-containing resin 4a will be described below. First, the phosphor-containing resin 4a obtained by mixing the phosphor 3 and transparent resin 8 is coated on the substrate 1 so as to cover the LED chip 2, using injection molding or the like. Thereafter, without being left to sit, the phosphor-containing resin 4a is thermally hardened before the phosphor 3 settles around the LED chip 2. Thus, the phosphor-containing resin 4a can be formed where the phosphor 3 is spread and dispersed throughout the phosphor-containing resin 4a.

Preferably, the LED light-emission device 10 according to Embodiment 1 or the LED light-emission device 10a according to Embodiment 2 is selected according to the purpose of use. Specifically, the LED light-emission device 10 can be employed in a case where bright light is desired, and the LED light-emission device 10a can be employed in a case where light that has uniform chromaticity in all radiated directions is desired.

Embodiment 3

Embodiment 3 of the present invention will be described with reference to FIG. 6. FIG. 6 is a sectional view of the configuration of a LED light-emission device 10b according to Embodiment 3. The LED light-emission device 10b differs from the LED light-emission device 10 with regard to the point that a phosphor-containing resin 4b is provided instead of the phosphor-containing resin 4; the other configurations are the same.

[Configuration of LED Light-Emission Device]

The phosphor-containing resin 4b differs from the phosphor-containing resin 4 with regard to the point of being made up of a sheet-shaped member (the point of being formed of a sheet-shaped member). The phosphor-containing resin 4b is a resin sheet containing the phosphor 3, and therefore the phosphor 3 does not settle in the phosphor-containing resin 4b when forming the phosphor-containing resin 4b on the substrate 1 to cover the upper face and sides of the LED chip 2. As a result, individual variance among LED light-emission devices 10b can be reduced regarding the state within the phosphor-containing resin 4b.

Now, in a case where there is variance in the thickness of the resin sheet, or the resin sheet is attached to the LED chip 2 in an inclined manner, or the like, it is conceivable that this may cause the distance of the light emitted from the LED chip 2 passing through the phosphor-containing resin 4b to change, thereby causing the color of the light emitted from the phosphor-containing resin 4b to the diffusing agent-containing resin 7 to change depending on the direction. However, even in such a case, the phosphor-containing resin 4b is sealed by the diffusing agent-containing resin 7, and thus the light from the phosphor-containing resin 4b is repeatedly diffused by the diffusing agent 5 and externally radiated. Accordingly, the colors of light emitted from the phosphor-containing resin 4b are mixed, and the light radiated from the LED light-emission device 10b has a uniform chromaticity in all directions.

An example of a method for forming the phosphor-containing resin 4b will be described below. First, a plasticizer is mixed in a thermo-hardening resin, and further the phosphor 3 is mixed therein, thereby forming a resin sheet. This resin sheet is placed on the LED chip 2 and heated. The resin sheet thus becomes semi-molten due to the heat, and adheres to the perimeter of the LED chip 2. Thereafter, the resin sheet is hardened in this state. Accordingly, the phosphor-containing resin 4b can be formed. Alternatively, the phosphor-containing resin 4b can be formed by a method of mixing phosphor 3 in thermo-hardening resin which is then formed into a gel sheet, and placed on the LED chip 2 and thermally hardened.

[Embodiment 4]

Figure 7:
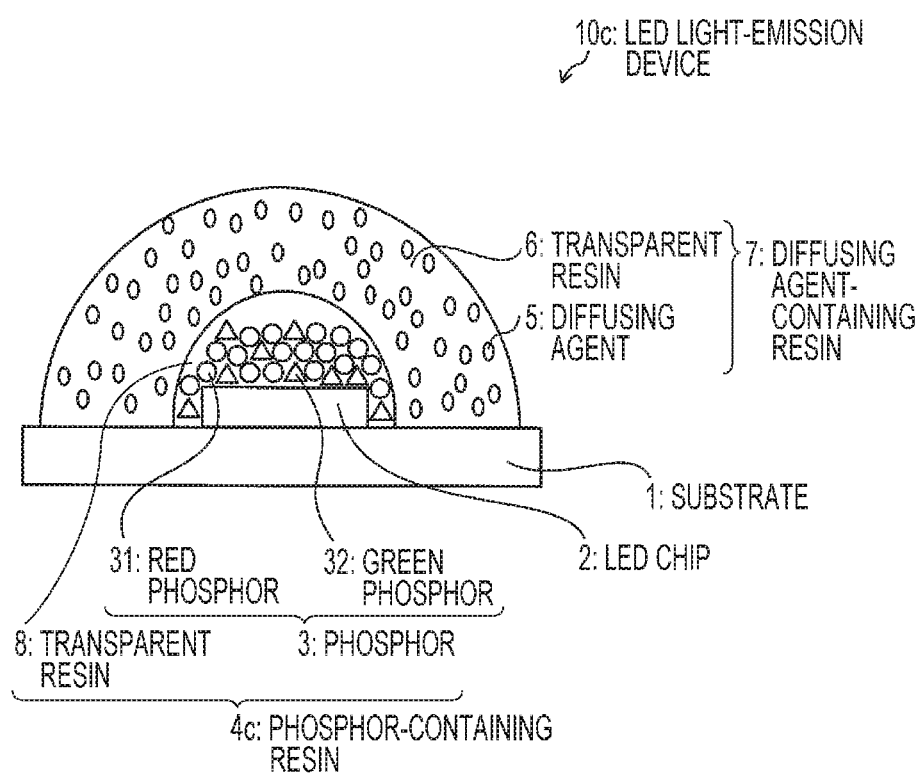
FIG. 7 is a sectional view illustrating the configuration of the LED light-emission device according to Embodiment 4.
Figure 8:
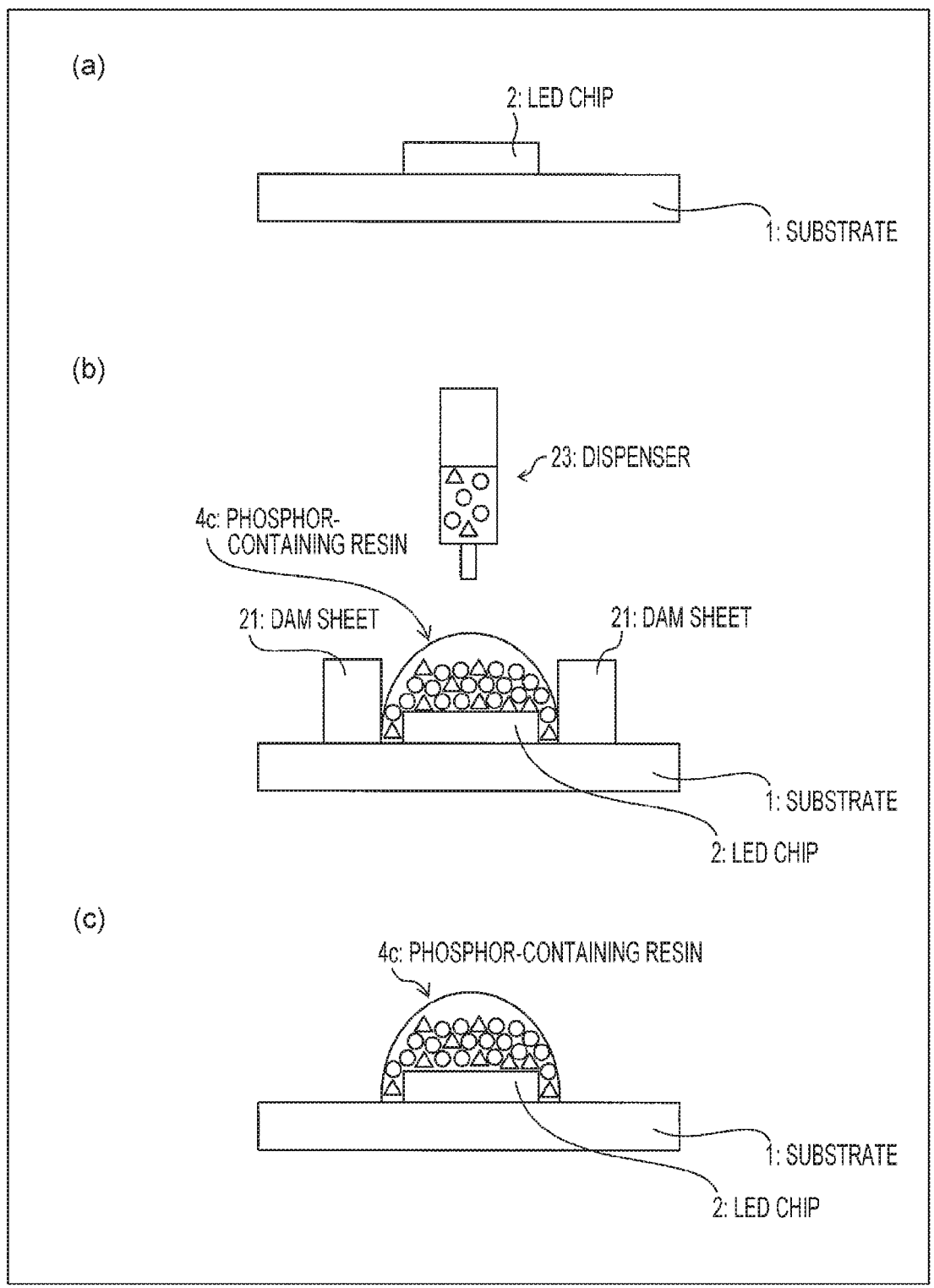
FIGS. 8(a) through 8(c) are diagrams illustrating a method of manufacturing phosphor-containing resin in the above LED light-emission device.

Embodiment 4 of the present invention will be described with reference to FIG. 7 and FIG. 8. FIG. 7 is a sectional view of the configuration of a LED light-emission device 10c according to Embodiment 4. The LED light-emission device 10c differs from the LED light-emission device 10 with regard to the point that a phosphor-containing resin 4c is provided instead of the phosphor-containing resin 4; the other configurations are the same.

[Configuration of LED Light-Emission Device]

The phosphor-containing resin 4c differs from the phosphor-containing resin 4 with regard to the point that a greater amount of phosphor 3 has settled around the LED chip 2 as compared with the phosphor-containing resin 4. More specifically, there are places in the phosphor-containing resin 4 where the phosphor 3 has settled around the LED chip 2 with spaces therebetween. However, the phosphor-containing resin 4c has phosphor 3 settled around the LED chip 2 uninterruptedly. In other words, phosphor 3 exists around the LED chip 2 uniformly in every direction. Accordingly, light emitted from the phosphor-containing resin 4c to the diffusing agent-containing resin 7 can be made to be light of uniform color in all directions more than as compared to light emitted from the phosphor-containing resin 4 to the diffusing agent-containing resin 7 according to Embodiment 1. As a result, light of a more uniform color in all directions can be radiated from the LED light-emission device 10c as compared with the LED light-emission device 10 in Embodiment 1.

Also, the phosphor 3 has settled around the LED chip 2 in the phosphor-containing resin 4c, in the same way as in Embodiment 1. Accordingly, light emitted from the phosphor 3 being absorbed by other phosphor 3 again can be reduced as compared to a case where the phosphor 3 exists in a manner dispersed so as to be spread throughout the phosphor-containing resin 4c, and therefore brightness can be maintained.

An example of a method for forming the phosphor-containing resin 4c will be described with reference to FIG. 8. FIGS. 8(a) through FIG. 8(c) are diagrams illustrating a method of forming the phosphor-containing resin 4c in the LED light-emission device 10c.

The LED chip 2 is first mounted on the substrate 1, as illustrated in FIG. 8(a). Thereafter, a dam sheet 21 (or dam ring) that can be removed is placed on the substrate 1 and phosphor-containing resin 4c is coated on the substrate 1 within the dam sheet 21 by a dispenser 23 or the like, for example, to cover the LED chip 2, as illustrated in FIG. 8(b). Thus, the phosphor-containing resin 4c can be prevented from spreading outwards near the sides of the LED chip 2 when coating the phosphor-containing resin 4c on the substrate 1. Accordingly, the base area of the phosphor-containing resin 4c can be reduced, and thus a greater amount of phosphor 3 settles around the LED chip 2 in the phosphor-containing resin 4c as compared to the phosphor-containing resin 4, even if the amount of phosphor 3 contained in the phosphor-containing resin 4c is the same as the amount of phosphor 3 contained in the phosphor-containing resin 4 in Embodiment 1. Thus, the phosphor-containing resin 4c can be formed (see FIG. 8(c)).

[Modification 1]

The phosphor-containing resin 4c can also be formed by increasing the ratio by weight of the phosphor 3 as to the transparent resin 8 contained in the phosphor-containing resin 4c to be greater than the ratio by weight of the phosphor 3 as to the transparent resin 8 contained in the phosphor-containing resin 4 according to Embodiment 1. Increasing the ratio by weight of the phosphor 3 as to the transparent resin 8 so that the amount of phosphor 3 contained in the phosphor-containing resin 4c is increased results in fewer regions where the phosphor 3 does not settle in the phosphor-containing resin 4c, so the phosphor-containing resin 4c where phosphor 3 has settled around the LED chip 2 uninterruptedly can be formed.

It is sufficient for the ratio by weight of the phosphor 3 as to the transparent resin 8 in the phosphor-containing resin 4c to be greater than 100% in the present modification. The greater the aforementioned ratio by weight is, the more phosphor 3 settles around the LED chip 2, and the chromaticity of light issued from the phosphor-containing resin 4c to the diffusing agent-containing resin 7 becomes more uniform. However, if the amount of phosphor 3 contained in the phosphor-containing resin 4 becomes excessively large, the viscosity of the phosphor-containing resin 4c increases. Increased viscosity of the phosphor-containing resin 4c may possibly lead to lower stability in the manufacturing process, such as the phosphor-containing resin 4c being more difficult to discharge from the dispenser 23 (see FIG. 8(b)), equal amounts not being able to be discharged, or the like, for example, resulting in variance among products. Accordingly, the ratio by weight of the phosphor 3 as to the transparent resin 8 in the phosphor-containing resin 4c according to the present modification is preferably greater than 100% but no more than 200%.

[Modification 2]

The phosphor-containing resin 4c can also be formed by making the thickness of the LED chip 2 to be thinner than that of the LED chip 2 according to Embodiment 1. Making the LED chip 2 thinner reduces the difference (difference in level) between the substrate 1 and the upper face of the LED chip 2, so the phosphor-containing resin 4c where phosphor 3 has settled around the LED chip 2 uninterruptedly can be formed.

In a normal double-sealed light-emission device using a phosphor-containing resin 4 of a type where phosphor 3 has settled, the phosphor 3 settles to around a place approximately 100 μm away from the substrate 1 in the layered direction of the phosphor-containing resin 4. Accordingly, the thickness of the LED chip 2 in the present modification is preferably 100 μm or less, and the phosphor-containing resin 4c can be formed without increasing the ratio by weight of the phosphor 3 as to the transparent resin 8, with making the thickness of the LED chip 2 to be 100 μm or less. The LED chip 2 can be made thinner by polishing the wafer or the like.

[In Conclusion]

A light-emission device comprising a flat substrate, at least one blue light-emission element that emits blue light where a peak wavelength of light emission is near 450 nm or 405 nm, a phosphor-containing resin containing at least two types of phosphor including red phosphor and green phosphor, that absorb light from the light-emission element and emit fluorescence, the red phosphor including at least one of a CaAlSiN3:Eu and a (Sr, Ca)AlSiN3:Eu and the green phosphor including at least one of a Lu3Al5O12:Ce and a (Si, Al)6(O, N)8:Eu, the phosphor-containing resin completely covering the light-emission element; and a diffusing agent-containing layer covering the phosphor-containing resin. The diffusing agent containing layer includes transparent resin and one type of diffusing agent having an average particle size of 3 to 5 µm where a ratio by weight of the diffusing agent and transparent resin is 10% to 30% and the diffusing agent is uniformly distributed in the diffusing-agent containing layer, diffuses light that has been output from the light-emission element and the output light of which the wavelength has been changed by the phosphor, emitted from the phosphor-containing resin, and is hemispherical. The light-emission element, phosphor-containing resin, and diffusing agent-containing layer are placed on a same flat face of the substrate. In a chromaticity diagram (CIE 1931), a difference between chromaticity coordinates of a color of light at each measurement angle, from measurement angle −80° to measurement angle +80°, radiated from the light-emission device, and chromaticity coordinates of a color of light at an intersection between a line that passes through the center of the diffusing agent-containing layer and is perpendicular to the substrate and a measurement arc, is −0.04 or more but +0.04 or less for both x value and y value. A light-emission device (LED light-emission device 10, 10a, 10b, 10c) according to a first mode of the present invention includes a substrate (1), a light-emission element (LED chip 2), a phosphor-containing layer (phosphor-containing resin 4, 4a, 4b, 4c) containing a phosphor (3) that absorbs light from the light-emission element and emits fluorescence, the phosphor-containing resin layer covering the light-emission element, and a diffusing agent-containing layer (diffusing agent-containing resin 7) containing a diffusing agent (5) that diffuses light emitted from the phosphor-containing layer, the diffusing agent-containing layer sealing the phosphor-containing layer. The light-emission element, phosphor-containing layer, and diffusing agent-containing layer are placed on a same flat face of the substrate.

According to the above configuration, the diffusing agent is contained in the diffusing agent-containing layer that seals the phosphor-containing layer sealing the light-emission element. Accordingly, light from the phosphor-containing layer, that is, light emitted from the phosphor and light (output light) from the light-emission element that reaches the diffusing agent-containing layer without the wavelength thereof being converted by the phosphor, are diffused by the diffusing agent. Accordingly, the color of the light emitted from the phosphor and the color of the output light mix with each other. As a result, irregularity in color of the light radiated from the light-emission device is prevented, and light of a uniform chromaticity is radiated in all directions in which light is radiated from the light-emission device.

Also, according to the above configuration, the light-emission element, phosphor-containing layer, and diffusing agent-containing layer are placed on a same flat face of the substrate. Accordingly, light emitted from the phosphor-containing layer reaches the diffusing agent-containing layer in regions along the substrate as well. Thus, there is no region, in the diffusing agent-containing layer, where light from the phosphor-containing layer does not reach, so there is no irregularity in brightness and color in the light radiated from the light-emission device, and light of a uniform chromaticity is radiated in all directions in which light is radiated from the light-emission device.

In the light-emission device (LED light-emission device 10, 10a, 10b, 10c) according to a second mode of the present invention, in the above-described first mode, the diffusing agent-containing layer (diffusing agent-containing resin 7) may have a hemisphere shape.

According to the above configuration, the diffusing agent-containing layer has a hemisphere shape, so light distribution is broader as compared to a case where the diffusing agent-containing layer has a shape other than a hemisphere shape. Consequently, light where there is no irregularity in brightness and color can be radiated from the light-emission device over a broad range.

In the light-emission device (LED light-emission device 10, 10c) according to a third mode of the present invention, in the above-described first or second mode, a greater amount of the phosphor (3) may exist near the surface and sides of the light-emission element (LED chip 2) in the phosphor-containing layer (phosphor-containing resin 4, 4c).

According to the above configuration, a greater amount of the phosphor exists near the light-emission element. Accordingly, the probability of light emitted from the phosphor striking and being absorbed by other phosphor again can be reduced. Thus, brightness of radiated light from the light-emission device can be maintained, by preventing light from the phosphor from being absorbed by other phosphor again which would cause the light emitted from the phosphor to become darker.

In the light-emission device (LED light-emission device 10a) according to a fourth mode of the present invention, in the above-described first or second mode, the phosphor (3) may be dispersed so as to be spread throughout the phosphor-containing layer (phosphor-containing resin 4a).

According to the above configuration, the phosphor is dispersed so as to be spread throughout the phosphor-containing layer. Accordingly, the output light from the light-emission element can uniformly strike the phosphor in all directions in which the light is output. Thus, of the light emitted from the phosphor-containing layer, the light from the phosphor and the output light can be prevented from being disproportionately biased in a particular direction. As a result, light of uniform color can be radiated from the light-emission device in all directions more than as compared to a case where the phosphor is not dispersed so as to spread throughout the phosphor-containing layer.

In the light-emission device (LED light-emission device 10b) according to a fifth mode of the present invention, in the above-described first or second mode, the phosphor-containing layer (phosphor-containing resin 4b) may be made up of a sheet member.

According to the above configuration, the phosphor-containing layer is made up of a sheet member. Accordingly, the phosphor does not settle within the phosphor-containing layer when forming the phosphor-containing layer on the substrate so as to cover the light-emission element. As a result, individual variance among light-emission devices can be reduced regarding the state within the phosphor-containing layer.

In the light-emission device (LED light-emission device 10, 10a, 10b, 10c) according to a sixth mode of the present invention, in any one of the above first through fifth modes, the phosphor-containing layer (phosphor-containing resin 4, 4a, 4b, 4c) may include a plurality of the phosphors (3), and light from the light-emission device (LED chip 2) may be converted by at least one of the plurality of phosphors to a wavelength different from another phosphor.

According to the above configuration, the phosphor-containing layer includes a plurality of phosphors, with light from the light-emission element being converted by at least one phosphor of the plurality of phosphors to a wavelength different from another phosphor. Accordingly, by combining red phosphor and green phosphor with a light-emission element that emits blue light, white light can be radiated.

In the light-emission device (LED light-emission device 10, 10a, 10b, 10c) according to a seventh mode of the present invention, in any one of the above first through sixth modes, the diffusing agent may be $SiO_2$.

According to the above configuration, the diffusing agent is formed of $SiO_2$. $SiO_2$ has excellent light resistance properties, heat resistance properties, and chemical resistance properties (acid and alkali). Accordingly, high reliability of diffusing light from the phosphor-containing layer can be maintained. Further, the specific gravity of $SiO_2$ is light as compared to the resin used for the transparent resin in which the diffusing agent is mixed, so the diffusing agent does not readily sink in the transparent resin while forming the diffusing agent-containing layer. Accordingly, the diffusing agent-containing layer can be formed while maintaining the uniformly distributed state of the diffusing agent in the transparent resin.

The present invention is not restricted to the embodiments described above. Various modifications may be made within the scope set forth in the Claims, and embodiments obtained by combining technical means disclosed in different embodiments are also encompassed by the technical scope of the present invention. New technical features can also be formed by combining technical means disclosed in the embodiments.

INDUSTRIAL APPLICABILITY

The present invention can be used in light-emission devices.

REFERENCE SIGNS LIST 1 substrate
2 LED chip (light-emission element)
3 phosphor
4, 4a, 4b, 4c phosphor-containing resin (phosphor-containing layer)
5 diffusing agent
7 diffusing agent-containing resin (diffusing agent-containing layer)
10, 10a, 10b, 10c LED light-emission device (light-emission device)

The invention claimed is:
1. A light-emission device comprising:
a flat substrate;
at least one blue light-emission element that emits blue light where a peak wavelength of light emission is near 450 nm or 405 nm and the at least one blue light-emission element has an upper face, corners, and sides;
a phosphor-containing resin containing at least two types of phosphor including red phosphor and green phosphor, that absorb light from the light-emission element and emit fluorescence, the red phosphor including at least one of a $CaAlSiN_3$:Eu and a $(Sr, Ca)AlSiN_3$:Eu and the green phosphor including at least one of a $Lu_3Al_5O_{12}$:Ce and a $(Si, Al)_6(O, N)_8$:Eu, the phosphor-containing layer completely covering the light-emission element, the at least two types of phosphor continuously covering the upper face, the corners, and the sides of the at least one blue light-emission element;
a diffusing agent-containing layer covering the phosphor-containing resin,
wherein the diffusing agent-containing layer includes transparent resin and one type of diffusing agent having an average particle site of 3 to 5 μm where a ratio by weight of the diffusing agent and transparent resin is 10% to 30% and the diffusing agent is uniformly distributed in the diffusing-agent containing layer, diffuses light that has been output from the light-emission element and the output light of which the wavelength has been changed by the phosphor, emitted from the phosphor-containing resin, and is hemispherical,
wherein the light-emission element, phosphor-containing resin, and diffusing agent-containing layer are placed on a same flat face of the substrate, and
wherein, in a chromaticity diagram (CIE 1931), a difference between chromaticity coordinates of a color of light at each measurement angle, from measurement angle −80° to measurement angle +80°, radiated from the light-emission device, and chromaticity coordinates of a color of light at an intersection between a line that passes through the center of the diffusing agent-containing layer and is perpendicular to the substrate and a measurement arc, is −0.04 or more but +0.04 or less for both x value and y value.

2. The light-emission device according to claim 1, wherein a greater amount of the phosphor exists near the surface and sides of the light-emission element in the phosphor-containing resin.

* * * * *